US006895372B1

(12) United States Patent
Knebel et al.

(10) Patent No.: US 6,895,372 B1
(45) Date of Patent: May 17, 2005

(54) SYSTEM AND METHOD FOR VLSI VISUALIZATION

(75) Inventors: Daniel R. Knebel, Carmel, NY (US); Mark A. Lavin, Katonah, NY (US); Jamie Moreno, Hartsdale, NY (US); Stanislav Polonsky, Mohegan Lake, NY (US); Pia N. Sanda, Chappaqua, NY (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/406,663

(22) Filed: Sep. 27, 1999

(51) Int. Cl.[7] .............................................. G06F 17/50
(52) U.S. Cl. ............................ 703/14; 703/13; 703/15; 703/19; 324/751; 324/752; 716/1
(58) Field of Search ................... 703/2, 14, 5; 324/751; 382/280

(56) References Cited

U.S. PATENT DOCUMENTS

| | | | | | |
|---|---|---|---|---|---|
| 4,675,832 | A | * | 6/1987 | Robinson et al. | 345/441 |
| 4,763,288 | A | * | 8/1988 | Deering et al. | 703/19 |
| 5,164,666 | A | * | 11/1992 | Wolfgang et al. | 324/751 |
| 5,251,159 | A | * | 10/1993 | Rowson | 703/14 |
| 5,270,643 | A | * | 12/1993 | Richardson et al. | 324/751 |
| 5,528,156 | A | * | 6/1996 | Ueda et al. | 324/751 |
| 5,539,652 | A | * | 7/1996 | Tegethoff | 703/14 |
| 5,555,201 | A | * | 9/1996 | Dangelo et al. | 716/1 |
| 5,940,545 | A | * | 8/1999 | Kash et al. | 382/312 |
| 6,028,952 | A | * | 2/2000 | Kash et al. | 382/141 |
| 6,128,768 | A | * | 10/2000 | Ho | 716/5 |
| 6,172,512 | B1 | * | 1/2001 | Evans et al. | 324/752 |
| 6,237,126 | B1 | * | 5/2001 | Bonitz | 716/4 |
| 6,263,301 | B1 | * | 7/2001 | Cox et al. | 703/14 |
| 6,327,394 | B1 | * | 12/2001 | Kash et al. | 382/280 |
| 6,342,701 | B1 | * | 1/2002 | Kash | 250/458.1 |
| 6,442,720 | B1 | * | 8/2002 | Koprowski et al. | 714/726 |
| 6,483,327 | B1 | * | 11/2002 | Bruce et al. | 324/752 |
| 6,496,022 | B1 | * | 12/2002 | Kash et al. | 324/752 |
| 6,515,304 | B1 | * | 2/2003 | Kash et al. | 257/79 |
| 6,650,768 | B1 | * | 11/2003 | Evans et al. | 382/145 |
| 6,774,647 | B2 | * | 8/2004 | Kash et al. | 324/752 |
| 2003/0122138 | A1 | * | 7/2003 | Kash et al. | 257/80 |

OTHER PUBLICATIONS

"Diagnosis and Characterization of Timing–Related Defects by Time–Dependent Light Emission", D. Knebel et al, International Test Conference, IEEE, Oct. 1998.*

(Continued)

*Primary Examiner*—Jean R. Homere
*Assistant Examiner*—Fred Ferris
(74) *Attorney, Agent, or Firm*—Scully, Scott, Murphy & Presser; Richard M. Ludwin

(57) ABSTRACT

A method and system for visualizing circuit operation. In the method device activity is obtained based on one or more of measured or simulated activity. The device activity is expressed in a representation, and the expressed activity is represented in a visual form. One suitable form of activity is the simulated version of the PICA slow motion movie. The invention may apply to other simulated design data vies as well, such as switch level simulation, current density simulation, and power density simulation.

41 Claims, 8 Drawing Sheets

OTHER PUBLICATIONS

"Failure Analysis of ULSI circuits Using Photon Emission", Y. Uraoka, IEEE Log No. 9211664, IEEE 1993.*

"The Attack of the "Holey Shmoos"; A Case Study of Advanced DFD and Picosecond Imaging Circuit Analysis (PICA)", W. Huott, ITC International Test Conference, IEEE, Jan. 1999.*

"An Integrated Photon Emission Microscope and MOSFET Caharterization System of Combinerd Microscopic and Macroscopi Device Analysis", T.H. Ng, IEEE Proceedings fo 7th IPFA x99, Aug. 1999.*

"New Failure Analysis of ULSI circuits Using Photon Emission", Y. Uraoka, Proc. IEEE 1992 Int. Conference on Microelctronis Test Structures, vol. 5, Mar. 1992.*

"Picosecond Imaging Circuit Analysis of the POWER3 Clock Distribution", P.N. Sandra, 1999 IEEE International Solid–State Conference, Jun. 1999.*

Miyake, et al., "Application of a fuzzy matching function to DNA sequence analysis", 6th Fuzzy Sytem Symposium, pp. 307–301, Sep. 6–8, 1990.

Rigoutsos, et al., "Combinatorial pattern discovery in biological sequence: The TEIRESIAS algorithm", BIOINFORMATICS, vol. 14, No. 1, pp. 55–67, Oxford University Press, Apr. 14, 1998.

* cited by examiner

SYSTEM AND METHOD FOR VLSI VISUALIZATION

FIELD OF THE INVENTION

The invention relates to visualization as an aid to the design, verification, and test of integrated circuits.

BACKGROUND OF THE INVENTION

As integrated circuits (IC) become increasingly dense and complex, all aspects of design, including custom and synthesized design, design verification and testing are becoming more and more difficult. The immensity of the data and the complex interrelationships among the various aspects of design including the design data, technology, and test, make it extremely difficult for IC designers to complete a design with confidence that it will function at the intended performance, and be manufacturable and reliable. Design aids that enable the visualization of circuit functionality, simulated under various operating conditions, process conditions, and electrical input conditions, that are interactive and cross-probeable with the device and circuit elements of the design views would greatly enhance the ability to create robust designs more effectively and in less time. This invention addresses this need by providing a system and method of visualizing the electrical activity and/or logical activity of an IC. It is easy to use and interpret, and the various design, simulation, and hardware data views contain parameterized, cross-probeable and interrelated content, at the transistor, gate, or circuit level. Here, the term "visualization" is used broadly, and include animation (for example, slow motion movies) with or without audio enhancement, plots of interrelationships between various dependent and independent variables, and also includes tactile outputs to assist the visually impaired.

A particular embodiment that relates a simulated view to a photon emission view and provides comparative visualizations of each, is disclosed herein. This particular embodiment relates to the commonly owned patent application Ser. No. 09/406,664 entitled METHOD FOR VLSI SYSTEM DEBUG AND TIMING ANALYSIS filed herewith, the disclosure of which is incorporated herein by reference. This patent application Ser. No. 09/406,664 provides a means by which to characterize internal IC switching activity by measuring and presenting photon emission data according to the technology described in the commonly owned and co-pending U.S. patent application Ser. No. 08/683,837, entitled NONINVASIVE OPTICAL METHOD FOR MEASURING INTERNAL SWITCHING AND OTHER DYNAMIC PARAMETERS OF CMOS CIRCUITS, filed Jul. 18, 1998, the disclosure of which is also incorporated herein by reference.

A feature of simulated picosecond imaging circuit analysis (PICA) is that any test or instruction set sequence may be applied to the circuit under investigation and will lead to observable results. This is contrasted to the present state of PICA measurements. Care must be taken to keep the PICA measurement loop short, and the test loop must be exercised repeatedly. This is because of the low level of emitted light in the photoluminescence process. This low light level, and the finite duration of the test loop make PICA measurement aquisition times slow. Thinning of the chip further increases the complexity of preparation of test. The simulation, however, is not limited by the low probability for photoluminescence, and any arbitrary test sequence or instruction sequence may be applied and the reaction visualized. The requirement to repeatedly exercise the circuit disappears for the case of PICA simulation. Simulation is also quick compared to measurement. Simulation is also amenable to characterization of the design prior to building the device. Hence, PICA simulation opens up many opportunities for improving designer productivity which have been heretofore unavailable by other means. An example of such a newly enabled application is a test coverage checker which produces output in a visual, intuitive manner.

The invention also relates to the problem of expressing causal relationships in a manner which is easily and intuitively interpreted. For example, circuit designers often analyze simulated circuit activity by plotting voltage waveforms on a common time base to visualize the causal relationships, such as shown in FIG. 1 for an inverter chain. The dotted lines pointing from one waveform to the next indicate the causal order of switching events. These relationships can be expressed in terms of a "sequence graph". FIG. 2 shows an example of a sequence graph, 12, for the invertor chain. The net names (1, 2, 3, etc.) are indicated at the nodes, as are the corresponding waveforms (a, b, c, etc.). The arrows connecting the nodes indicate the causal relationship between the voltage behaviors at the nets.

SUMMARY OF THE INVENTION

It is an object of this invention to provide a system and method to visualize the simulated internal functioning of ICs for effective design evaluation, design of test, and comparison to the measured internal functioning of ICs as measured using techniques such as the newly available photon emission measurement also known as PICA. An output of the PICA system is a visual representation of transistor switching events, in the form of a slow motion video. The present invention is related to visualization of simulated IC activity. One form of activity further described in the preferred embodiment is the simulated version of the PICA slow motion "movie". This has multiple uses, including i) predicting and thereby preparing test and analysis approaches for PICA measurement, ii) learning through visual study of the switching behavior aligned to the physical layout or optical microscope image, iii) flagging of improper behavior such as incorrect logical operation occurring during certain ranges of simulation conditions, and iv) comparison of the visualizations between simulation and measured data sets.

The structure comprising the system and the method of use apply not only to the visualization of simulated emission images but apply to other simulated design data views as well. Examples are switch level simulation, current density simulation, and power density simulation.

The preferred system and method described herein use a sequence graph which represents the causal activity induced upon a circuit network by a stimulus. This sequence graph may then be annotated with the visualization representation, such as PICA emissions at devices connected to the elements of the graph. Likewise, other visualizations such as current, local power dissipation, local noise, etc., may be annotated in this way.

DETAILED DESCRIPTION OF THE PREFERRED EMBODIMENTS

The preferred embodiment provides a system, structures, and method by which visualization of the simulated circuit behaviors and properties is performed within an IC CAD viewer. These visualizations are viewable within the IC viewer along with the regular device views and measured IC data, verification traces, logical data, and test data. In the case of electrical simulation, currents simulated at nets can be computed to form PICA representations, time varying power maps at the individual transistor and net level, noise, and electromigration maps, to name a few types of visualizations. The novelty of electrical simulation visualization is the viewing of complex circuit activity in an intuitive fashion, down to the individual device level. This can be related to measured circuit activity at the device level by methods such as PICA. As mentioned in the background, there are situations where simulated PICA is more accessible than the physically measured PICA for the analysis of design because there are no constraints on the test for simulation, and simulation is fast compared to measurement. When visualizing the physical responses of the elements comprising the device, such as nets and transistors, the visualization computation is very efficient because of the compact nature of the response data in the form of a "sequence graph" which contains the representation of the responses including connectivity and causality. The visualization engine need not search the entire dataset of responses from elements of the device, but only those that are influenced by the stimulus. The relationships between the elements, including the cause and effect relationships, and pointers to the desired data to enter visualization, such as voltage waveforms or PICA emissions, are all included in this "sequence graph" representation.

It is noted that visualization may take place at any arbitrary design hierarchy, including mixed hierarchy. For example, for PICA visualization, it is natural to view the emissions on top of the flattened physical design view. For viewing logical activity, one might visualize activity of logical blocks which may be comprised of more than one leaf cell. The desired hierarchy, or mixture of hierarchy, may be defined by interaction with the user interface.

Figure 3:
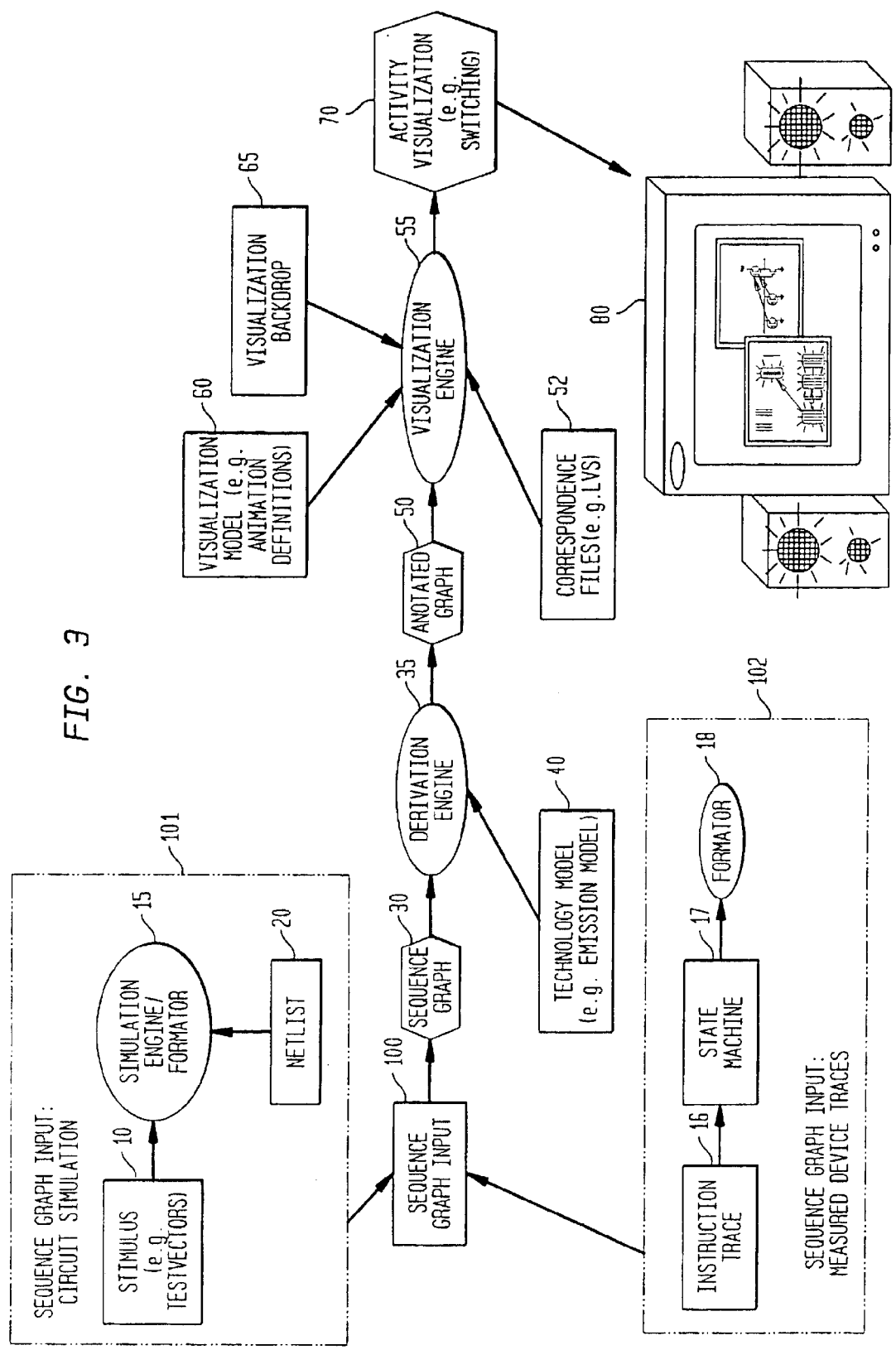
FIG. 3 illustrates a switching visualization system, structures comprising the system, and the flowchart which shows how the elements of the system are used together in the method.

FIG. 3 illustrates the switching visualization system, structures comprising the system, and the flowchart which shows how the elements of the system are used together in the method. Generalized input, 100, is expressed in terms of a sequence graph, 30. For the preferred embodiment, this input is the output of a circuit simulator, such as a SPICE simulation. This is shown inside the dotted box, 101. Stimuli such as testvectors, 10, are applied to the circuit netlists, 20. The circuit simulator, 15, provides outputs in the form of waveforms or currents at the desired netlist elements.

Device activity traces are another type of generalized input, 100, shown in the Figure. This is illustrated in the lower dotted box, 102. These traces may be measured, which is the case of the example shown in the Figure, or they may be simulated. For measured traces, the inputs are instruction sequences which are applied to the device (state machine). The measured outputs are "traces" which are a sequence of logical states (0's and 1's) at designated register bits or other designated elements. These traces are then expressed into the sequence graph format.

For the case of simulation, stimuli such as instruction set sequences or testvectors are applied to the network under analysis, to produce traces at designated trace locations such as register array bits. The simulation may be a logical simulator or a circuit simulator. There are advantages to using both simulation methods and visualizing each view. In each case, the trace application input would consist of a sequence of 0's and 1's indicating the register bit states at each cycle of the state machine under analysis. The visualization provided by the system may consist of a physical mapping of the logical states on the physical design data, schematic design data, or logical data. Additional internal "probe" points of the network may be designated for simulation output for the sake of visualization. Then, the activity leading to the traces may be visualized in logical or waveform formats. A circuit simulator would provide voltage or current waveforms, in which the trace application would proceed as previously described.

For debugging, the progression of logical states, and wire delays visualized together may help path analysis and optimization. A further application is the checking of the instruction traces themselves. One could check the logical progression of the instruction trace through the device to visualize if the instruction trace is indeed exercising the device as intended. For example, a legacy instruction trace may not be effective in exercising a new machine implementation and in this case, the differences may be visualized intuitively. Certain measures could also be derived for the instruction trace such as: relative utilization of elements, power dissipation, noise generation, etc. Each of the aforementioned measures may be derived at the local element level, or at the global level. For example, it would be useful to obtain a value for the power dissipated when a certain instruction sequence is run. Information from the instruction trace dependence on power may be used to characterize the device power dissipation. This information could be used for compiler optimization for power, for example. This simulation would provide a far more accurate estimation for power than the switching factor estimates largely in use today. Again, these computations and visualizations become traceable with the compact connectivity and causality expression provided by the sequence graph notion. Similarly, traces may be created to maximize noise. The work to create suitable instruction traces for noise tolerance test may be done by simulation. The optimized instruction trace, or testvector sequenced derived from the instruction trace or from the sequence graph, would be utilized in the IC hardware test. In the latter derivation of a testvector sequence to mimick the instruction set, comparison of the sequence graphs for each case would provide a measure of how well the testvector recreates the activity generated by the instruction trace. A further application might maximize skew. Skew tolerance measured through simulation could then be used to tune wires to improve the skew tolerance of the device as necessary. A wire optimization tool may even be programmed to take as input, the annotated sequence graph, in this case annotated with timing data from the simulations or measurements. Similarly, testvectors may be verified and debugged or characterized in much the same manner.

Figure 1:
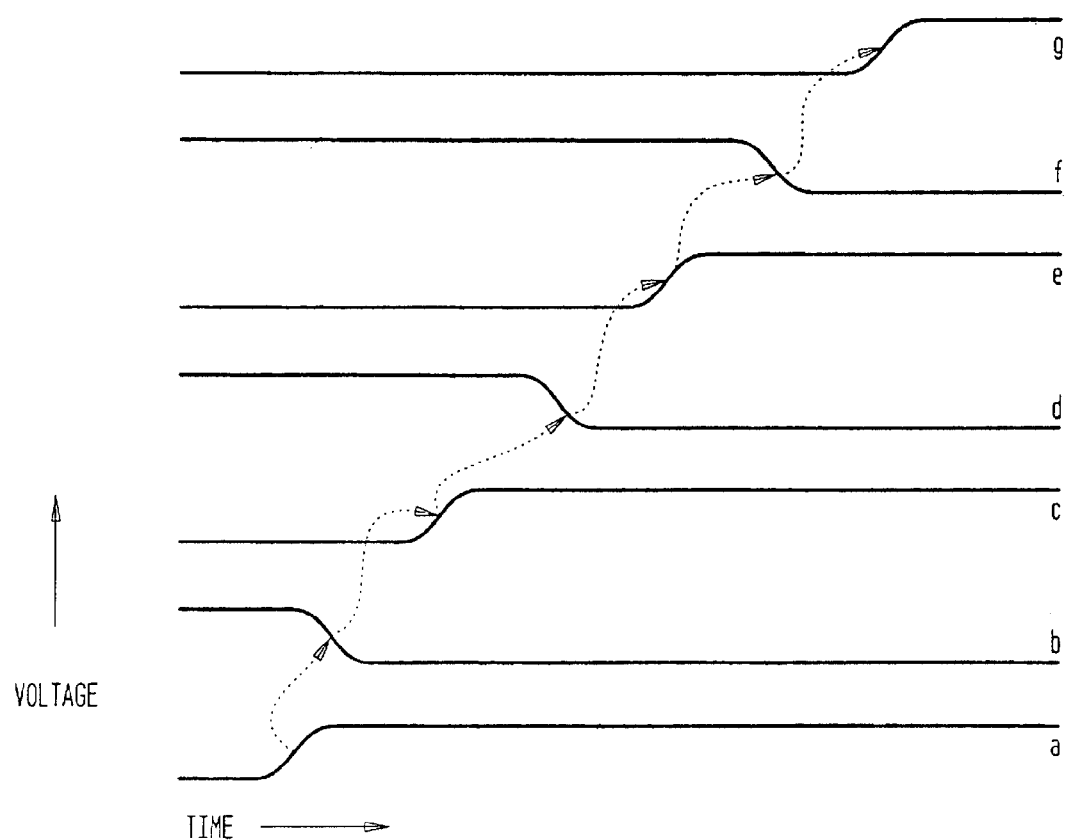
FIG. 1 illustrates voltage waveforms corresponding to a delay chain of inverters, with the causal relationships indicated.
Figure 2:
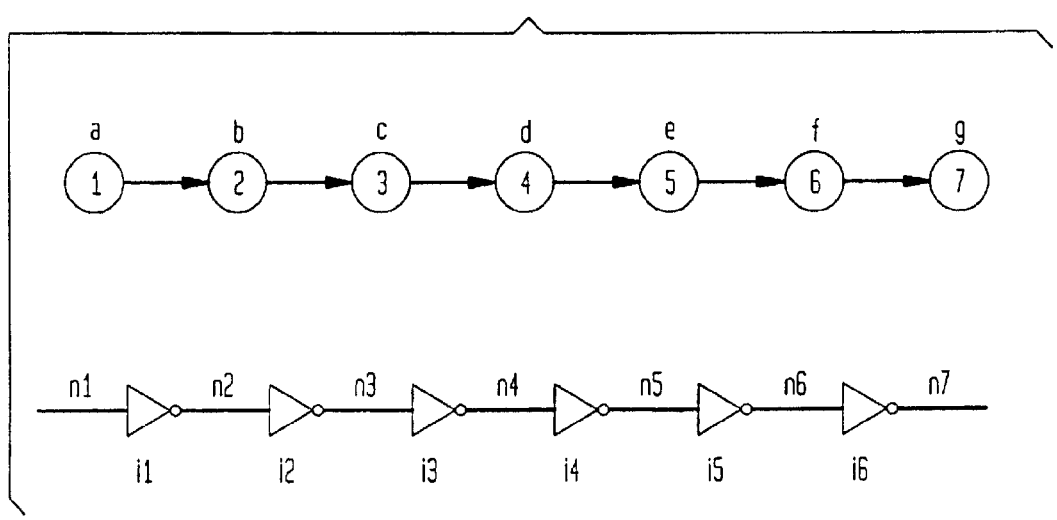
FIG. 2 illustrates a sequence graph for an inverter chain (top), and corresponding schematic (bottom).

The reaction of the circuit to the system input, 100, may be represented in the sequence graph, 30. The sequence graph is derived from the netlist or schematic, and comprises a record of the events that occurred within the network as a result of the system input. For the case of the digital circuit schematic network, the sequence graph may be a cone of logic with base at the input(s) which propagates signal to the outputs, latch points, or other points of interest. FIG. 2 shows a sequence graph (top) for the simple case of an inverter chain. The corresponding schematic is shown on the bottom of the Figure. The nodes of the sequence graph represent the states at the nets (n1 through n7 of the schematic), with the leftmost node corresponding to the input. The nodes are also annotated (a,b,c, etc.) with identifiers for the corresponding voltage waveforms of FIG. 1.

Figure 4:
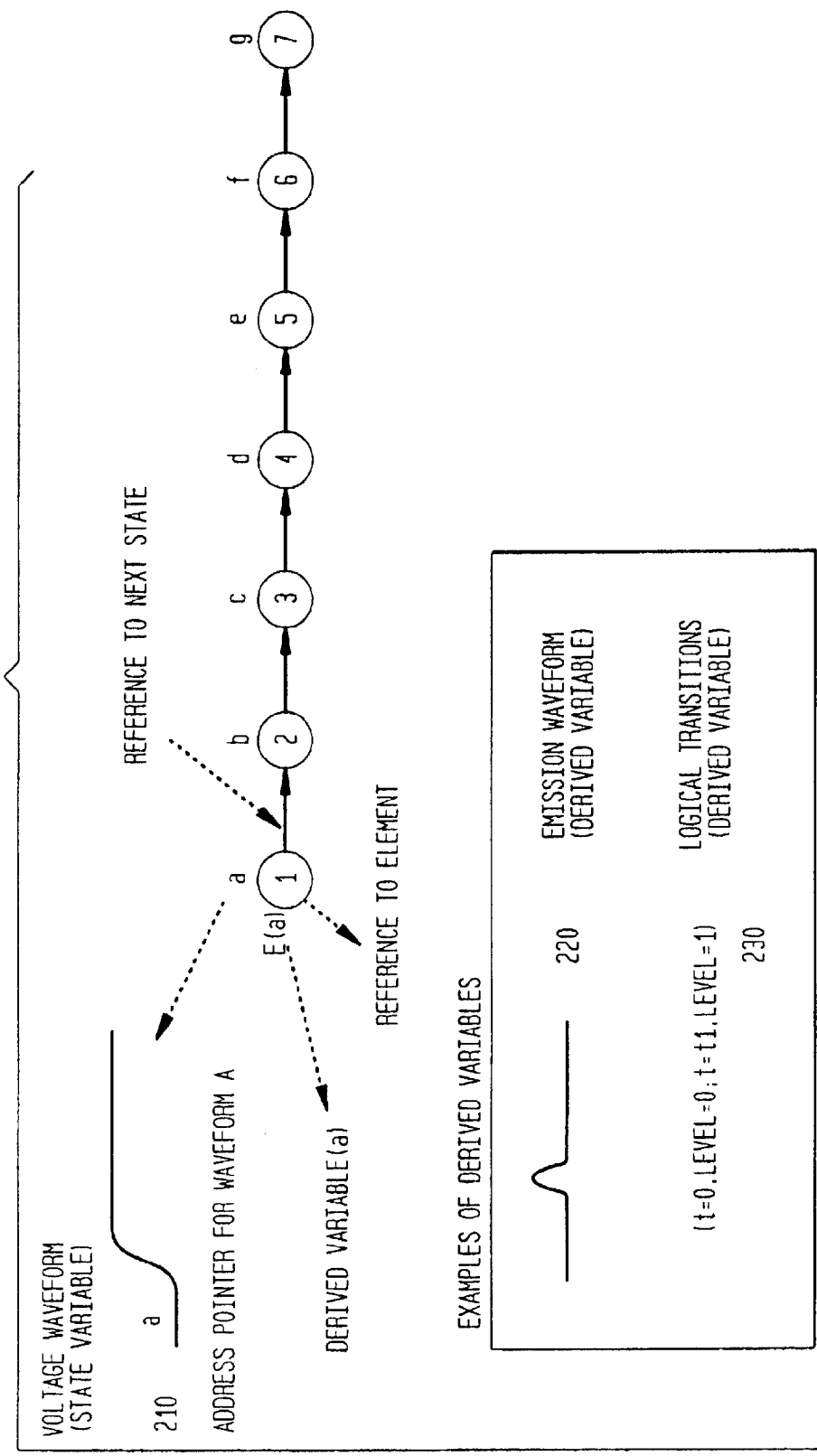
FIG. 4 illustrates the annotation structure of an annotated sequence graph file.

FIG. 4 depicts the structure of a sequence graph. Again, the inverter chain is used to illustrate the point. The node is annotated with the element to which it corresponds. For the first node, the element is net 1. There is also a pointer to the address for the corresponding state variable, in this case, the voltage waveform, 210, at net 1, which is labeled "a". There is also a reference to the next state(s), represented by the arrow between the nodes of the graph illustration. Other variables, such as optical emission waveforms, 220, or transition sequences, 230, can be derived from the state variables (as depicted by the derivation engine, 35, in FIG. 3). The Figure shows that the graph may also contain pointers to one or more derived variables. If convenient, separate sequence graphs for each variable type, or set of variable types, may be retained.

The appropriate technology model (in this case, optical emission waveforms can be derived from the current waveforms and the optical emission model) is provided as input to the derivation engine. The output of the derivation engine are the derived variables, and these may be annotated upon the sequence graph to form an annotated graph, 50. Going back to FIG. 4, 230 depicts logical transition state data as another example of a derived variable. Other possible derived data are local noise fluctuations, power line bounce, local power dissipation, and so forth. These comprise the annotated sequence graph, 50, FIG. 3. The technology model input to enable derivation of the derived variables is depicted by 40 in the Figure. The Figure depicts the sequence graph and annotated sequence graph as separate entities, generated separately, to simplify teaching of the separate activities and computations involved. However, it is obvious to one skilled in the art that the delineation of the sequence graph and annotated sequence graph may be broadly defined and still come within the scope of the invention. It would be convenient to annotate the original sequence graph with the state variables, or pointers to the state variables. Subsequent computation would result in the derived variables, which would conveniently be annotated to the same sequence graph, to comprise the annotated sequence graph. The original representation of the sequence graph may be retained, or discarded at any point in the process.

In another related implementation, still consistent with the spirit of the embodiment shown in the Figure, multiple sequence graph files are generated and retained, should multiplicity be convenient in the visualization flow. In the latter case, the appropriate pointers between the variables relevant to the various visualizations would facilitate the concurrent visualization of two or more circuit response representations. A graphical user interface and data structure that supports toggling between two or more views would be valuable to the designer to intuitively relate two representations of the circuit responses. For example, viewing of the circuit activity (e.g., voltage, current, or optical emission, etc.) in the physical (layout or physical image) view would be enabled concurrently with the schematic view visualization. Here, the graphical user interface would provide functions or stop, forward, backward, step, integral. "Step" provides function to step through the "frames" of the animation, and "integral" displays the entire set of activities demonstrated. The latter could be the computed integrated emission in the case of optical emission, or could be a total switching activity visual report in other views (for example, the schematic view). The latter would provide an intuitive rendering of the cone of logic influenced by the stimulus (or subset, thereof—not all influenced devices would necessarily switch). Furthermore, the causal relationship may be illustrated in the static or dynamic visualizations. For the integrated view, it would be especially useful to have pointers such as arrows to depict the causal relationships. While causality might be inferred in the case of a schematic view, arrows depicting causality would clarify the dependencies when multiple signal paths may influence a particular gate. These pointers, or arrows, would be turned on or off by the user. An objective of this inventions is to supply the designer with views of the circuit response with the aid of intuitive visualizations which may be combined as desired and be presented in as simple or in as much detail as desired, so that he/she may best interpret the circuit activity.

Returning to FIG. 3, the annotated sequence graph, 50, and visualization models, 60, and the layout vs. schematic file (to recognize the devices/nets which are relevant to the visualization) are input to the visualization engine, 55. The visualization models comprise those relationships that are needed to compose the visualization, 70. An example of a visualization model for optical emission visualization are the emission models, which compute optical emission as a function of space and time in the vicinity of an emitting transistor. These models, together with the annotated sequence graph content, and visual backdrop, 65, comprise the inputs to the visual simulation engine, 70. Having on hand the relevant time varying data (those state variables and derived variables) and causal relationships between them, mappings to the circuit elements, and visualization models to render these variables against a backdrop, a richness of visualizations become possible. The resulting renderings work dynamically and interactively with the graphical user interface to vary the time and spatial (such as region, rotation, etc.) domains, and traverse design hierarchy as desired.

The rendering of the various views is finally visualize at an output device, 80. Here, a designer's workstation is depicted with the renderings within an IC viewer shown on the display. It is obvious that the output device as shown may be replaced by a variety of clients and still be consistent with the invention. depicted on the display (front) is a rendering of an optical emission in the layout view, and in the schematic view (back).

Figure 5:
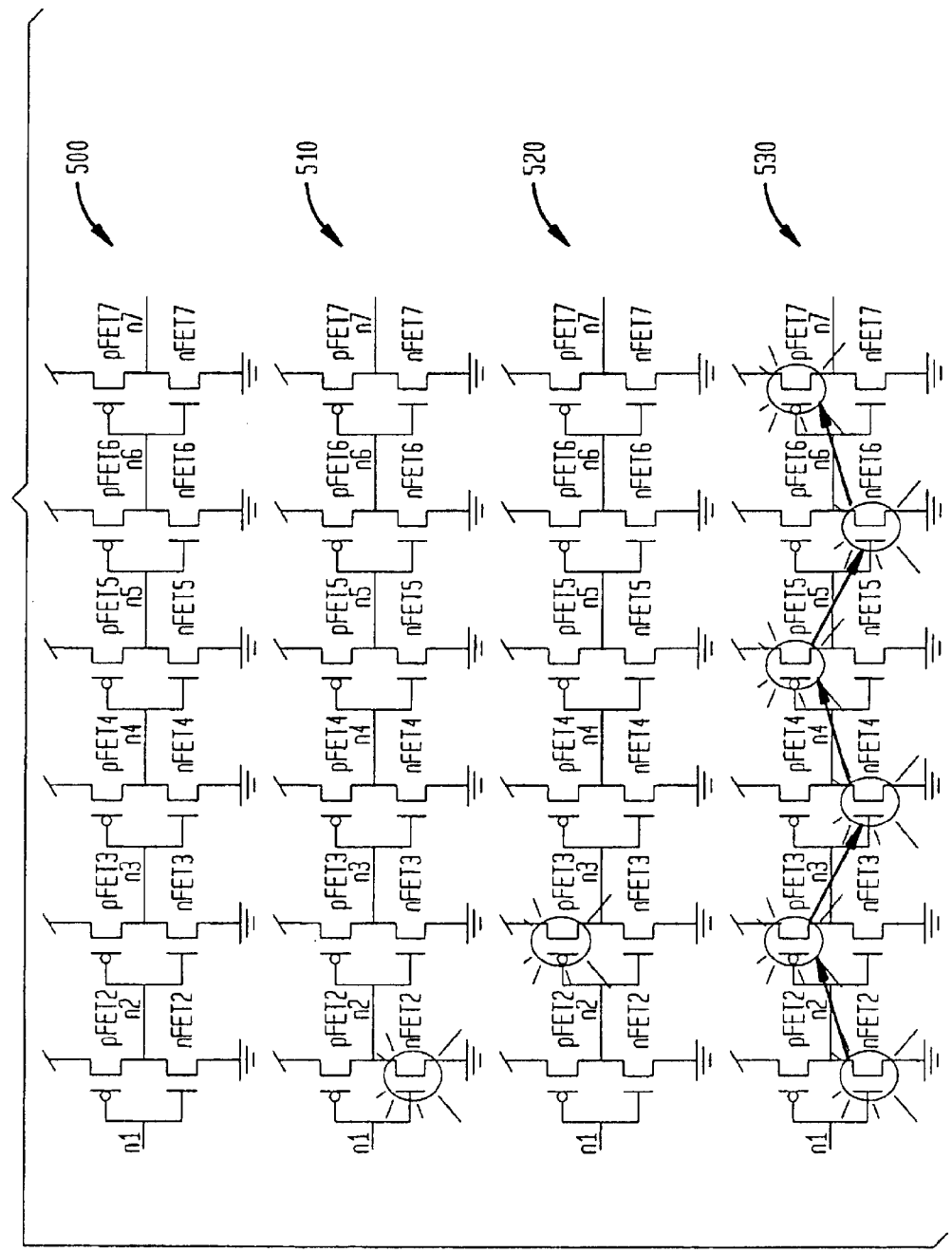
FIG. 5 illustrates the flow of a photon emission simulation.

FIG. 5 again uses the simple example of an inverter chain to illustrate how circuit activity may be visualized in the schematic view, in the form of an animation or a still, integrated, image. Here, the individual transistors are explicitly drawn in the circuit schematic, 500. In 510, transistor nFET2 is shown "lit up" to represent that the transistor is switching, and/or is conducting current, and/or emitting light. In 520 pFET2 is shown "lit up". This would occur a number of "time frames" after nFET2 is active, but the Figure only depicts the frame that the emission is at its maximum. 530 depicts as integrated view, with all of the transistors "lit up", and arrows directed between them to indicate the causal order of events.

Figure 6:
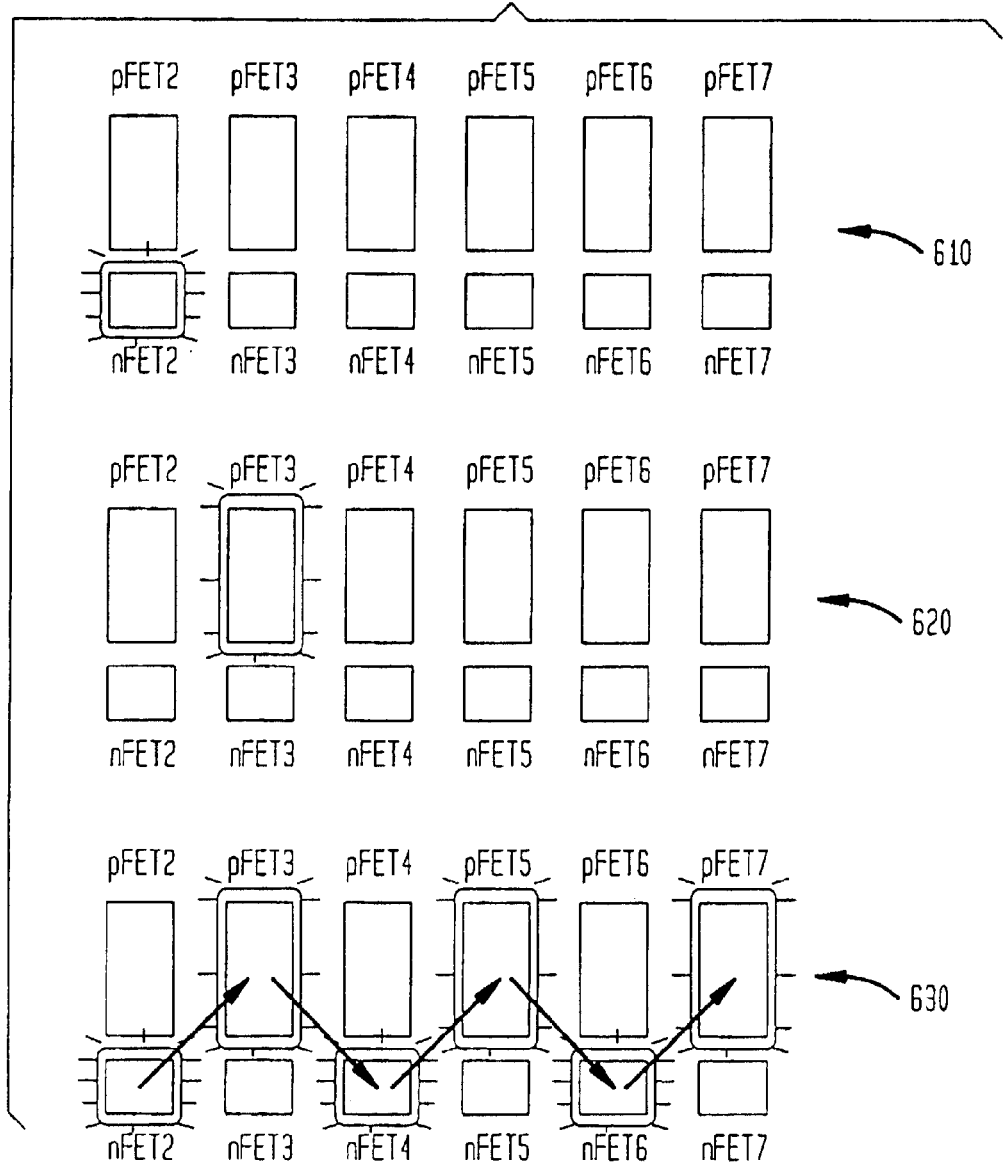
FIG. 6 shows areal images of the simulated emission corresponding to a physical design during two time intervals.

FIG. 6 illustrates, again using the simple example of an inverter chain, optical emission activity overlayed on a layout view. Here, for simplicity, the MOSFET device regions are indicated by rectangles. Those familiar with the present state of PICA activity will know that pMOSFETs emit much less than nMOSFETs. For simplicity, pMOSFET and nMOSFET emission strength is not differentiated in the illustration. 610 illustrates nFET2 "lit up" in this layout view, 620 illustrates the next event, where pFET2 "lights up", and 630 illustrates the integrated emission where all of the active transistors are "lit up", and arrows between them are shown to indicate the causal ordering of events.

Figure 7:
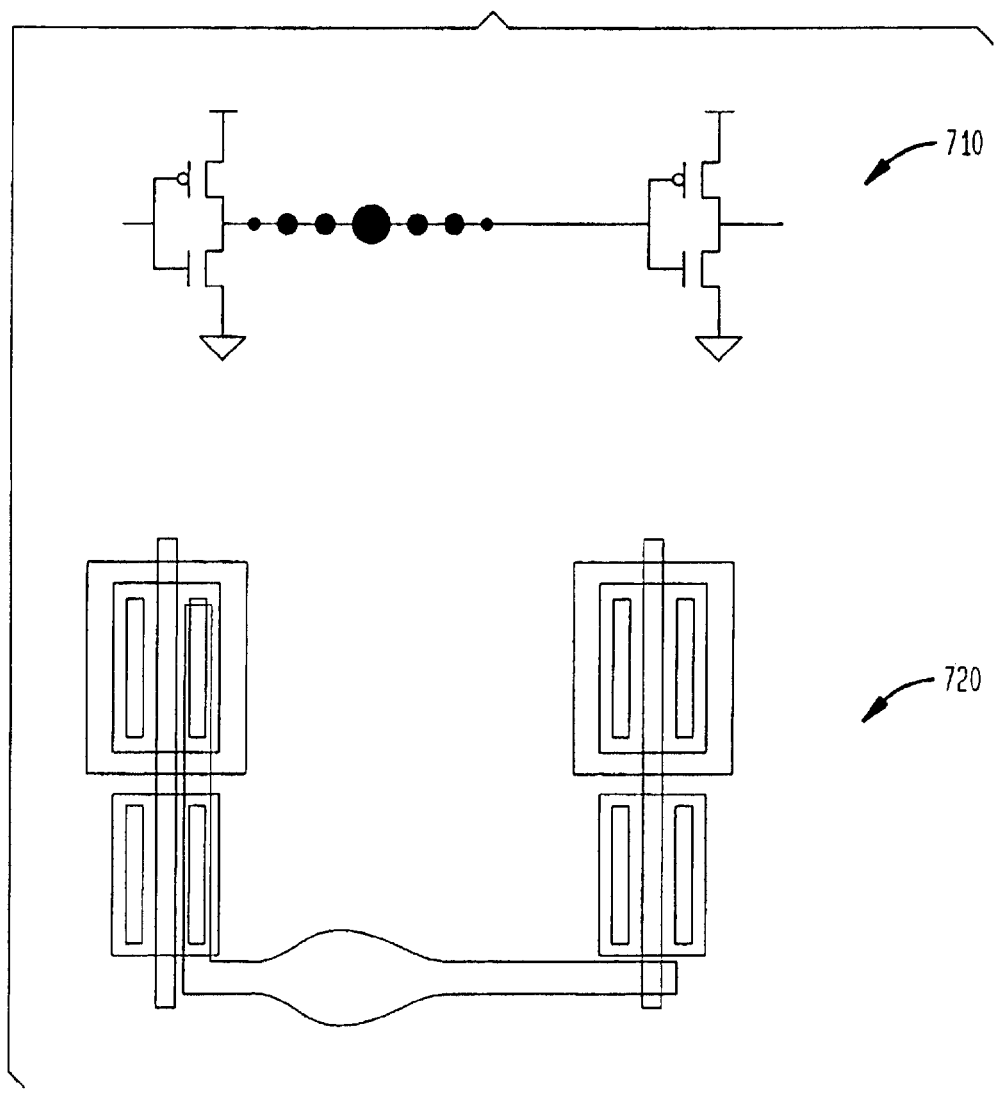
FIG. 7 illustrates a tool that compares simulated data to measured emission data.

Another rendering is a current flow visualization, as shown in FIG. 7. Element 710 illustrates, in the schematic view, current flow along the net connecting two inverters. Element 720 shows current flow depicted in a physical design view using the imagery of a lump traveling through the network. Here, the area of the lump could be colored to highlight the charge motion and to differentiate it in the still view, with a physical structure. The current could also be depicted as a bright dot moving along the network for each net carrying a current, for example.

Another rendering is a voltage visualization. Here, wires and transistors would be the backdrop, and the activity would be the motion of a voltage wavefront moving through the network. A net, or portion of a net, would be colored, for example, and deepen as it reaches a voltage rail. Vdd and ground could be represented by differing colors.

Another rendering is the charting of the sequence graph, or annotated sequence graphs or derivatives of, themselves. The sequence of causal relationships of a nontrivial network may be plotted such as 12 of FIG. 2, to show the causal ordering of events. Several paths may be shown on one chart to illustrate parallel path behavior.

It is noted that complex circuits, and complex circuit types benefit from analysis of the subject visualization system and method. For example, asynchronous circuits are a particular challenge for timing analysis as well as state analysis. The detailed timing behavior and logical state behavior is difficult to characterize since the usual clock boundaries and rules do not apply. The present invention provides means of characterizing asynchronous circuits in detail, retaining all of the causal relationships that form the network reaction to a given stimulus. The state variables and derived variables may be analyzed, and the sequence graph, or annotated sequence graph may be directly analyzed for consistency with expected behaviors (rules expressed in terms of the causal relationships).

Those of ordinary skill in the art will understand that with this system, numerous other visualizations of circuit activity may be rendered within the scope of this invention. These may include noise simulation, electromigration fault simulation, power dissipation simulation, and so forth.

It is noted that data reduction and management are important for practical implementation. Compact representation of the transistor level data uses device recognition (by layout vs. schematic assignment).

It is further noted that this data may again be processed to emphasize differences, golden image comparisons, etc. It is further noted that the various visualizations may be brought up in any IC viewer, and may be cross-probed between themselves or the design, verification, or test views, as appropriate.

Figure 8:
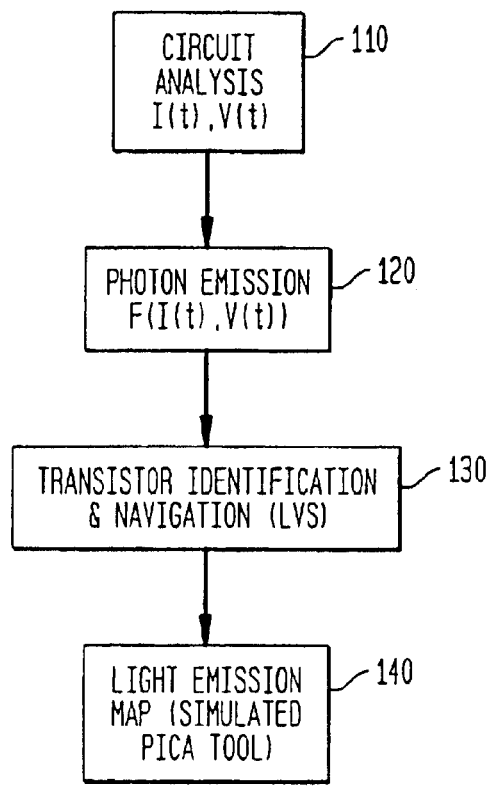
FIG. 8 illustrates the operation of an optical emission simulator.

A particular embodiment is a substructure which enables the visualization of simulated circuit functionality in slow motion time, one form of which is an animation of the optical emissions which occur as a result of a certain input set of stimuli. While this can be expressed in the general system and method of FIG. 3, in this particular case, a direct "hardwired" route to the animations and still imagery is effective. The optical emission means of representing switching events in the animation is a natural presentation of the events for studying and interpreting circuit behavior, and is amenable to the "motion picture" medium. FIG. 8 illustrates the process flow, starting with (110) which presents the simulation results in terms of currents and/or voltages (I(t) and/or V(t)) describing the circuit activity, and (120) is the photon emission simulation result, F(I(t), V(t)), for each emitting transistor. The coordinates of the emitting transistors are located and the photon emission at each transistor is overlayed with the layout view. Here, the spatial variation at each transistor is computed in accordance with a physical model which assigns intensity to the emissions in the spatial regions in the vicinity of the transistor channel regions. The physical assignment might be a Gaussian spreading function applied to point sources located at preassigned "pixel regions" at and in the vicinity of the transistor channel. A Monte Carlo simulation may also be exercised to create a randomized distribution of photon events. The simulation visualization has been described in the copending commonly owned patent application entitled "METHOD FOR VLSI SYSTEM DEBUG AND TIMING ANALYSIS". The simulated emissions are overlayed over the physical design data to aid in the visualization and interpretation of the emission data. A photomicrograph image of the region of interest might also be used for the overlay if desired. Images such as these can be combined in time sequence to make a slow motion movie of circuit activity. It is noted that this particular embodiment may be implemented with or without the aid of a sequence graph for the end implementation.

Figure 9:
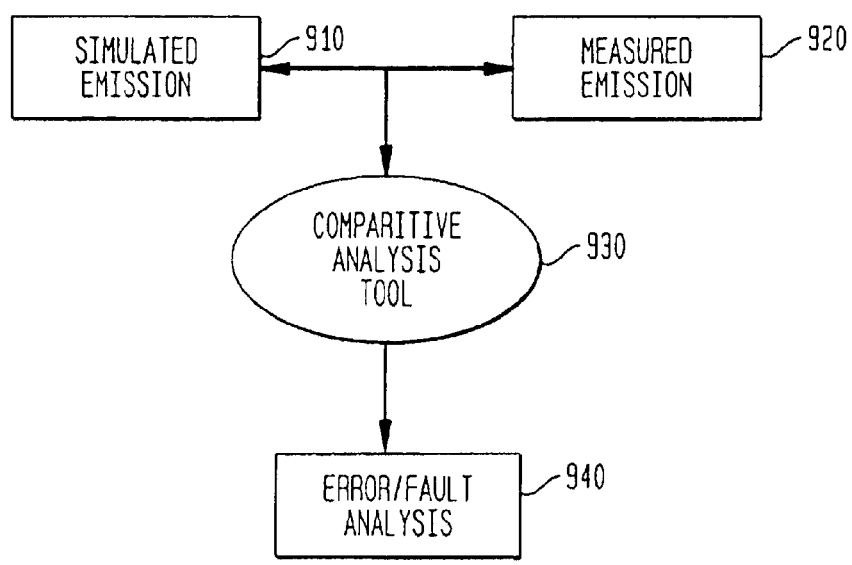
FIG. 9 illustrates a method for comparing simulated emissions to measured optical emissions.

Once the simulated emissions are computed and areally interpreted as described above, comparison may be made to measure optical emissions as a diagnostics or comparative analysis technique. The method is illustrated in FIG. 9. The simulated and measured emissions, (910) and (920), respectively, are compared and analyzed for differences by the comparative analysis tool (930). The output of (930) is a representation of the errors and faults (940). The concept of comparative analysis between simulated and measured results may be generalized to other visualizations such as current and voltage measurements in a similar fashion.

In each case the objects being compared need not be limited to areal images. In the case where a sequence graph exists this may be compared to the measured data in several different ways. A sequence graph corresponding to the measurement may be derived and compared to the simulation, or the simulated sequence graph may be compared to the measurement by one to one correspondence comparison between derive emissions as interpreted from each representation. It is not necessary to have complete correspondences between each emission. For instance, an emission may be predicted in the simulation that is below observability of the measurement and is thereby not observed in the measurement. However, if an emission is observed in the measurement that is not observed in the simulation, a fault may be detected.

What is claimed is:

1. A method for visualizing internal functioning of operation of an integrated circuit, comprising:

a. the step of obtaining device activity based on one or more of measured or simulated activity of the device;

b. the step of expressing the obtained device activity in a defined representation form; and c. the step of representing the expressed activity, by using said defined representation form, in a visual form that illustrates causal relationship that one or more device activities has on one or more other device activities;

wherein said representing step includes the step of visualizing the device activity representation as a simulation of optical emissions that occur as a result of the device activity.

2. A method according to claim 1, wherein said representation includes sequence, connectivity and causal relationship information.

3. A method according to claim 1, wherein said representing step includes the step of visualizing the expressed activity in an IC CAD viewer.

4. A method according to claim 1, wherein the obtaining step includes the steps of:

applying device activity traces as inputs to the circuit; and measuring sequences of logical states at designated elements.

5. A method according to claim 4, wherein the expressing step includes the step of expressing the measured sequences in a sequence graph format.

6. A method according to claim 1, wherein said obtaining step includes the step of obtaining an activity trace based on one or more of measured or simulated activity.

7. A method according to claim 1, wherein the visual form is a slow motion animation.

8. A method according to claim 7, wherein the slow motion animation is a video visualization.

9. A method according to claim 1, wherein the visual form is an animated schematic.

10. A method according to claim 9, wherein in the animated schematic, the devices or collection of devices appear highlighted, or change color, shape or otherwise visualize the occurrence of switching.

11. A method according to claim 1, wherein audio representation of circuit activity augments the visualization by the occurrence of sound in conjunction with the visual indication of circuit activity.

12. A method according to claim 11, wherein the audio frequency or other audio character is related to the timing relationships of the switching events.

13. A method according to claim 12, wherein the timing relationships of the switching events include delay from prior switching event, or device transition speed, or input to output delay.

14. A method according to claim 1, wherein switching behavior is mapped to a mathematical graphical representation which is related to a netlist.

15. A method according to claim 1, further comprising the step of modeling the emissions as a hot electron photoluminescence model.

16. A method according to claim 1, further comprising the step of assigning the emission based on a two-state model according to whether the device is switching or not.

17. A method according to claim 16, wherein the method of determining the switching state of a device is by thresholding the current.

18. A method according to claim 16, further comprising the step of assigning the switching state by checking for logical state transitions at nets corresponding to the terminals of a device to detect if the device switches in response to the input level(s) to the device.

19. A method according to claim 1, wherein an areal view of the simulation is produced from the simulation emission.

20. A method according to claim 1, further comprising the step of designating regions of a device as an array of pixels overlaid to the device.

21. A method according to claim 19, wherein the areal distribution model is a Gaussion distribution from point sources from designated areas of the device.

22. A method according to claim 19, wherein the illumination intensity at each pixel results from a Monte Carlo simulation of events.

23. A method according to claim 1, wherein the visual form is a current flow animation.

24. A method according to claim 1, wherein the visual form is a local power dissipation animation.

25. A method according to claim 1, wherein the visual form is a verification trace animation.

26. A method according to claim 1, wherein the simulated activity is a circuit electrical simulation and is conducted for manufacturing test and subsequently animated.

27. A method according to claim 1, wherein the visual form is a sequence graph depicting the causal order of waveform transition events.

28. A method according to claim 26, wherein the electrical simulation is conducted for manufacturing test and subsequently animated for optical emission.

29. A method according to claim 1, wherein optical emission measurement data is compared to optical emission simulation data and the regions of agreement or disagreement between the two are identified.

30. A method according to claim 1, wherein logical state data gathered from optical emission measurement is compared to logical state data from simulation and the areas of agreement or disagreement between the two are identified.

31. A method according to claim 1, wherein the expressing step includes the step of expressing the device activity in a sequence graph format.

32. A method according to claim 31, wherein the sequence graph is derived from a netlist or schematic, and comprises a record of the events that occurred within the network as a result of the system input.

33. A method according to claim 1, wherein the obtaining step includes the step of obtaining optical emissions from the circuit as a result of stimuli input to the circuit.

34. A method according to claim 33, wherein the optical emissions are generated by switching activity caused by the input stimuli.

35. A method for visualizing internal functioning of operation of an integrated circuit, comprising:

a. the step of obtaining device activity based on one or more of measured or simulated activity of the device;

b. the step of expressing the obtained device activity in a defined representation form; and c. the step of representing the expressed activity, by using said defined representation form, in a visual form that illustrates causal relationship that one or more device activities has on one or more other device activities, wherein:

the obtaining step includes i) the step of using an instruction trace to obtain a first representation of device activity, and ii) the step of using a testvector sequence to obtain a second representation of device activity; and further including the step of comparing the first and second representations to determine how well the testvector recreates the activity generated by the instruction trace.

36. A method for visualizing internal functioning of operation of an integrated circuit, comprising:

a. the step of obtaining device activity based on one or more of measured or simulated activity of the device;
b. the step of expressing the obtained device activity in a defined representation form; and
c. the step of representing the expressed activity, by using said defined representation form, in a visual form that illustrates causal relationship that one or more device activities has on one or more other device activities, wherein:
   the obtaining step includes the step of using a testvector sequence to cause device activity; and
   further including the step of analyzing said device activity to verify or debug the testvector sequence.

37. A method according to claim 1, wherein the circuit is an asynchronous circuit.

38. A system for visualizing behavior of an integrated circuit, comprising:
   a. means for simulating activity of the circuit, wherein said simulator activity causes optical emissions from the circuit;
   b. means for expressing the circuit activity as a defined device activity representation; and
   c. means for visualizing the device activity representation as a simulation of optical emissions that are caused by the activity that is being simulated.

39. A system according to claim 38, wherein said device activity representation includes sequence, connectivity and causal relationship information.

40. A method according to claim 38, wherein said means for visualizing includes an IC CAD viewer for visualizing the expressed activity.

41. A system according to claim 38, wherein the means for simulating circuit activity includes:
   means for applying device activity traces as inputs to the circuit; and
   means for measuring sequences of logical states at designated elements.

* * * * *